United States Patent
Wang et al.

(10) Patent No.: US 7,422,961 B2
(45) Date of Patent: Sep. 9, 2008

(54) METHOD OF FORMING ISOLATION REGIONS FOR INTEGRATED CIRCUITS

(75) Inventors: Haihong Wang, Fremont, CA (US); Minh-Van Ngo, Fremont, CA (US); Qi Xiang, San Jose, CA (US); Paul R. Besser, Sunnyvale, CA (US); Eric N. Paton, Morgan Hill, CA (US); Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 637 days.

(21) Appl. No.: 10/389,456

(22) Filed: Mar. 14, 2003

(65) Prior Publication Data
US 2004/0180509 A1    Sep. 16, 2004

(51) Int. Cl.
    *H01L 21/762* (2006.01)
(52) U.S. Cl. ...................................... 438/431
(58) Field of Classification Search ......... 438/424–426, 438/431
See application file for complete search history.

(56) References Cited

U.S. PATENT DOCUMENTS

| | | | |
|---|---|---|---|
| 5,254,873 A | 10/1993 | Poon et al. | |
| 5,266,813 A | 11/1993 | Comfort et al. | |
| 5,406,111 A | 4/1995 | Sun | |
| 5,455,194 A | 10/1995 | Vasquez et al. | |
| 5,668,044 A * | 9/1997 | Ohno | 438/433 |
| 5,700,712 A | 12/1997 | Schwalke | |
| 5,719,085 A * | 2/1998 | Moon et al. | 438/424 |
| 5,793,090 A | 8/1998 | Gardner et al. | |
| 5,837,612 A | 11/1998 | Ajuria et al. | |
| 6,013,937 A | 1/2000 | Beintner et al. | |
| 6,037,238 A | 3/2000 | Chang et al. | |
| 6,074,930 A | 6/2000 | Cho et al. | |
| 6,074,931 A | 6/2000 | Chang et al. | |
| 6,080,618 A | 6/2000 | Bergner et al. | |
| 6,080,627 A | 6/2000 | Fan et al. | |
| 6,080,637 A | 6/2000 | Huang et al. | |
| 6,087,705 A | 7/2000 | Gardner et al. | |
| 6,107,143 A | 8/2000 | Park et al. | |
| 6,136,664 A * | 10/2000 | Economikos et al. | 438/431 |
| 6,146,970 A | 11/2000 | Witek et al. | |

(Continued)

FOREIGN PATENT DOCUMENTS

EP    0 245 622    11/1987

(Continued)

OTHER PUBLICATIONS

Peter Van Zant Microchip fabrication Mcgraw Hill 1977 pp. 31 and 39.*

(Continued)

*Primary Examiner*—Stephen W. Smoot
(74) *Attorney, Agent, or Firm*—Foley & Lardner LLP

(57) ABSTRACT

A method of manufacturing an integrated circuit (IC) utilizes a shallow trench isolation (STI) technique. The shallow trench isolation technique is used in strained silicon (SMOS) process. The liner for the trench is formed from a semiconductor or metal layer which is deposited in a low temperature process which reduces germanium outgassing. The low temperature process can be a CVD process.

19 Claims, 8 Drawing Sheets

U.S. PATENT DOCUMENTS

| | | | |
|---|---|---|---|
| 6,150,212 | A | 11/2000 | Divakaruni et al. |
| 6,168,961 | B1 | 1/2001 | Vaccari |
| 6,207,531 | B1 | 3/2001 | Pen-Liang |
| 6,214,696 | B1 | 4/2001 | Wu |
| 6,271,143 | B1 | 8/2001 | Mendicino |
| 6,306,722 | B1 | 10/2001 | Yang et al. |
| 6,335,293 | B1 * | 1/2002 | Luo et al. .................. 345/173 |
| 6,391,731 | B1 | 5/2002 | Chong et al. |
| 6,399,512 | B1 | 6/2002 | Blosse et al. |
| 6,414,364 | B2 | 7/2002 | Lane et al. |
| 6,426,278 | B1 | 7/2002 | Nowak et al. |
| 6,456,370 | B1 | 9/2002 | Ingles, Jr. |
| 6,468,853 | B1 | 10/2002 | Balasubramanian et al. |
| 6,498,383 | B2 | 12/2002 | Beyer et al. |
| 6,524,931 | B1 | 2/2003 | Perera |
| 6,548,261 | B1 | 4/2003 | Smith et al. |
| 6,548,361 | B1 | 4/2003 | En et al. |
| 6,566,228 | B1 | 5/2003 | Beintner et al. |
| 6,613,646 | B1 | 9/2003 | Sahota et al. |
| 6,646,322 | B2 * | 11/2003 | Fitzgerald .................. 257/531 |
| 6,656,749 | B1 | 12/2003 | Paton et al. |
| 6,673,696 | B1 * | 1/2004 | Arasnia et al. ............. 438/430 |
| 6,706,581 | B1 | 3/2004 | Bou et al. |
| 2002/0045312 | A1 | 4/2002 | Zheng et al. |
| 2002/0098689 | A1 | 7/2002 | Chong et al. |
| 2003/0049893 | A1 | 3/2003 | Currie et al. |
| 2003/0139051 | A1 | 7/2003 | Andideh et al. |
| 2004/0061161 | A1 | 4/2004 | Radens et al. |
| 2004/0089914 | A1 | 5/2004 | Mouli et al. |

FOREIGN PATENT DOCUMENTS

| | | |
|---|---|---|
| GB | 2 254 731 | 10/1992 |
| WO | WO 02/095818 A1 | 11/2002 |
| WO | WO 02/101818 A2 | 12/2002 |

OTHER PUBLICATIONS

John L Vossen Thin Film Processes II Acedemic Press 1991 p. 333.*
U.S. Appl. No. 10/341,863, filed Jan. 14, 2003, entitled "Shadow Trench Isolation for Strained Silicon Processes" (26 pgs.).
U.S. Appl. No. 10/341,848, filed Jan. 14, 2003, entitled "Post Trench Fill Oxidation Process for Strained Silicon Processes" (17 pgs.).
U.S. Appl. No. 10/358,966, Filed Feb. 5, 2003, entitled "Shallow Trench Isolation Process Using Oxide Deposition and Anneal For Strained Silicon Processes" (19 pgs.).
Written Opinion of the International Searching Authority; International Application No. PCT/US2004/007464; International Filing Date Mar. 11, 2004; 6 pgs.
International Search Report; International Application No. PCT/US2004/007464; mailed Sep. 1, 2004; 3 pgs.
Ohkubo, Satoshi; Tamura Yasuyuki; Sugino, Rinji; Nakanishi, Toshiro; Sugita, Yoshihiro; Awaji, Naoki and Takasaki, Kanetake; "High Quality Ultra-Thin (4nm) Gate Oxide by UV/0$_3$ Surface Pre-Treatment of Native Oxide"; 1995 Symposium On VLSI Technology; Digest of Technical Papers; Jun. 6-8, 1995; Kyoto, Japan; 3 pgs.
Written Opinion of the International Searching Authority; International Application No. PCT/US2004/000982; International Filing Date Jan 13, 2004; 6 pgs.
International Search Report for PCT/US2004/000982, 4 pages.
Wolf, Stanley, Ph.D. and Tauber, Richard N., Ph.D.; "Silicon Processing for the VLSI Era"; vol. 1: Process Technology; Lattice Press; 1986; pp. 57-58, 194.
Ghandhi, Sorab K. "VLSI Fabrication Principles"; John Wiley and Sons; 1983; pp. 422-423.
Rim, K., Welser, J., Hoyt, J.L., and Gibbons, J.F., "Enhanced Hole Mobilities in Surface-channel Strained-Si p-MOSFETs", 1995 International Electron Devices Meeting Technical Digest, 5 pages.
Welser, J., Hoyt, J.L., Takagi, S. and Gibbons, J.F., "Strain Dependence of the Performance Enhancement in Strained-Si n-MOSFETs", 1994 International Electron Devices Meeting Technical Digest, San Francisco, CA Dec. 11-14, 1994, 5 pages.
International Preliminary Report on Patentability for PCT/US2004/007464, dated Jan. 7, 2005, 9 pages.
Demand for International Preliminary Examination of International Patent Application No. PCT/US2004/007464, dated Jan. 6, 2005, 4 pages.
U.S. Appl. No. 10/620,194, filed Jul. 15, 2003, entitled "Front Side Seal to Prevent Germanium Outgassing"; 22 pgs.
International Search Report for PCT/US2004/000982, 4 pages, 2004.

* cited by examiner

METHOD OF FORMING ISOLATION REGIONS FOR INTEGRATED CIRCUITS

CROSS REFERENCE TO RELATED APPLICATIONS

The present application is related to U.S. application Ser. No. 10/241,863, filed by Ngo et al. on Jan. 14, 2003 and entitled "Shallow Trench Isolation for Strained Silicon Processes". The present application is also related to U.S. application Ser. No. 10/358,966, filed on Feb. 5, 2003 by Lin et al. and entitled "Shallow Trench Isolation Process Using Oxide Deposition and Anneal for Strained Silicon Processes" and U.S. application Ser. No. 10/341,848, filed on Jan. 14, 2003 by Arasnia et al. and entitled "Post Trench Fill Oxidation Process for Strained Silicon Processes"

FIELD OF THE INVENTION

The present invention is related to integrated circuit (IC) devices and to processes of making IC devices. More particularly, the present invention relates to a method of forming trench isolation structures on substrates or layers including germanium.

BACKGROUND OF THE INVENTION

Integrated circuits (ICs) include a multitude of transistors formed on a semiconductor substrate. Various methods of forming transistors on a semiconductor substrate are known in the art. Generally, transistors are isolated from each other by insulating or isolation structures.

One method of forming transistors on a silicon substrate involves the well-known Local Oxidation of Silicon (LOCOS) process. A conventional LOCOS process typically includes the following simplified steps. First, a silicon nitride layer is thermally grown on the silicon substrate. Generally, conventional LOCOS processes require a high quality, thermally grown silicon nitride layer to avoid delamination and other processing problems. Next, using a lithography and etch process, the nitride layer is selectively removed to produce a pattern where transistor source/drain areas are to be located. After patterning the source/drain areas, a field oxide is grown. As oxide growth is inhibited where the nitride layer still remains, the oxide only grows on the silicon substrate exposed during the source/drain patterning step. Finally, after oxide growth is complete, the remaining portions of the nitride layer are removed, leaving only the oxidized source/drain areas on the exposed silicon substrate.

Another process for forming insulating structures and defining source and drain regions is a shallow trench isolation (STI) process. A conventional STI process typically includes the following simplified steps. First, a silicon nitride layer is thermally grown or deposited onto the silicon substrate. Next, using a lithography and etch process, the silicon nitride layer is selectively removed to produce a pattern where transistor source/drain areas are to be located. After patterning the source/drain areas, the substrate is etched to form trenches. After the trenches are formed, a liner is thermally grown on the exposed surfaces of the trench. The liner oxide is typically formed at a very high temperature in a hydrochloric (HCl) acid ambient. An insulative material, such as, silicon dioxide ($SiO_2$), is blanket deposited over the nitride layer and the liner oxide within the trench. The insulative material is polished to create a planar surface. The nitride layer is subsequently removed to leave the oxide structures within the trenches.

Shallow trench isolation (STI) structures are utilized in strained silicon (SMOS) processes. SMOS processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer.

The silicon germanium lattice associated with the silicon germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another.

Relaxed silicon has a conductive band that contains six equal valence bands. The application of tensile strain to the silicon causes four of the valence bands to increase in energy and two of the valence bands to decrease in energy. As a result of quantum effects, electrons effectively weigh 30 percent less when passing through the lower energy bands. Thus, the lower energy bands offer less resistance to electron flow. In addition, electrons meet with less vibrational energy from the nucleus of the silicon atom, which causes them to scatter at a rate of 500 to 1000 times less than in relaxed silicon. As a result, carrier mobility is dramatically increased in strained silicon compared to relaxed silicon, providing an increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

The use of germanium in SMOS processes can cause germanium contamination problems for IC structures, layers, and equipment. In particular, germanium outgassing or outdiffusion can contaminate various components associated with the fabrication equipment and integrated circuit structures associating with the processed wafer. Further, germanium outgassing can negatively impact the formation of thin films. In addition, germanium outdiffusion can cause germanium accumulation or "pile-up" at the interface of the liner, thereby causing reliability issues for the STI structure.

Germanium outgassing can be particularly problematic at the very high temperatures and HCl ambient environments associated with the liner of a shallow trench isolation (STI) structure. For example, conventional STI liner oxide processes can utilize temperatures of approximately 1000° C. which enhance germanium outgassing.

Thus, there is a need for an STI liner which can be formed in a low temperature process. Further still, there is a need for a process of forming high quality oxides with good compatibility and yet are not susceptible to germanium outgassing. Further still, there is a need for an SMOS trench liner formation process. Yet further, there is a need for a liner formation process that is not as susceptible to germanium outgassing. Further still, there is a need for an STI process that does not utilize high temperature to thermally grow liners.

SUMMARY OF THE INVENTION

An exemplary embodiment relates to a method of manufacturing an integrated circuit. The integrated circuit includes trench isolation regions in a substrate including germanium. The method includes forming a mask layer above the substrate, and selectively etching the mask layer to form apertures associated with locations of the trench isolation (STI)

regions. The method also includes forming trenches in the substrate at the locations, providing a semiconductor or metal layer within the trenches in a low temperature process, and forming oxide liners using the semiconductor or metal layer in the trenches of the substrate.

Yet another exemplary embodiment relates to a method of forming shallow trench isolation regions in a semiconductor layer. The method includes providing a hard mask layer above the semiconductor layer, providing a photoresist layer above the hard mask layer, and selectively removing portions of the photoresist layer in a photolithographic process. The method further includes removing the hard mask layer at the locations, forming trenches in the hard mask layer under the locations, providing a conformal semiconductor layer in the trenches, and converting the conformal semiconductor layer into an oxide liner in the trenches.

Yet another exemplary embodiment relates to a method of forming a liner in a trench in a germanium containing layer. The method includes selectively etching the germanium containing layer to form the trench, providing a semiconductor layer in the trench in a low temperature process, and forming an oxide liner from the semiconductor layer.

BRIEF DESCRIPTION OF THE DRAWINGS

Exemplary embodiments will become more fully understood from the following detailed description, taken in conjunction with the accompanying drawings, wherein like reference numerals refer to like parts, and wherein.

DETAILED DESCRIPTION OF REFERRED EXEMPLARY EMBODIMENTS

Figure 1:
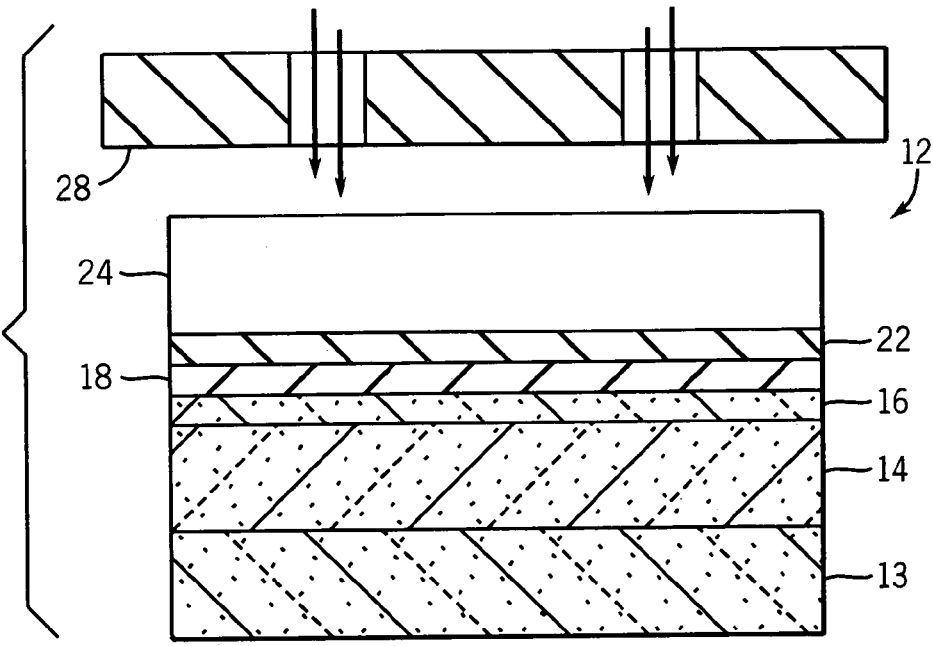
FIG. 1 is a cross-sectional view schematic drawing of a portion of a silicon germanium substrate including a strained silicon layer, an oxide layer, a hard mask layer and a photoresist layer in accordance with an exemplary embodiment of a shallow trench isolation (STI) process.

FIGS. 1 through 9 illustrate a method of manufacturing an integrated circuit (IC) in accordance with an exemplary embodiment. The method illustrated in FIGS. 1 through 9 reduces germanium outgassing and outdiffusion problems associated with silicon germanium layers or structures. The process can be used in a shallow trench isolation (STI) process or any process requiring a liner oxide and utilizing germanium or other substance prone to outgassing at high temperature. Advantageously, a liner oxide layer can be formed at low temperature and yet provide a high quality oxide with good compatibility. For the purposes of the embodiment described with reference to FIGS. 1-9, a low temperature process refers to a process performed at a temperature of less than approximately 700° C.

Referring to FIGS. 1 through 9, a cross-sectional view of a portion 12 of an integrated circuit (IC) is illustrated. Portion 12 is subjected to process 100 (FIG. 9) to form a shallow trench isolation (STI) structure. Portion 12 includes an oxide layer 18 provided over a strained silicon layer 16. Layer 16 is provided over a semiconductor substrate 14 or a germanium-containing layer or substrate. Substrate 14 can be provided above a substrate 13.

Substrate 13 is optional and portion 12 can be provided with substrate 14 as the bottom-most layer. The embodiment described with reference to FIGS. 10-21 shows a substrate 114 without a substrate, such as, substrate 13 (FIG. 1) beneath it. Substrate 13 can be the same material or a different material than substrate 14. In one embodiment, substrate 13 is a semiconductor substrate such as a silicon substrate upon which silicon germanium substrate 14 has been grown.

Portion 12 can be any type of semiconductor device, or portion thereof, made from any of the various semiconductor processes, such as a complementary metal oxide semiconductor (CMOS) process, bipolar process, or other semiconductor process. Portion 12 may be an entire IC or a portion of an IC, and may include a multitude of electronic component portions.

Substrate 14 is preferably silicon germanium or other semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}$ Ge$_x$, where X is approximately 0.2 and is more generally in the range of 0.1-0.4). Layer 14 can be grown or deposited.

In one embodiment, layer 14 is grown above layer 13 by chemical vapor deposition (CVD) using disilane (Si$_2$H$_6$) and germane (GeH$_4$) as source gases with a substrate temperature of approximately 650° C., a disilane partial pressure of 30 mPa and a germane partial pressure of 60 mPa. Growth of silicon germanium material may be initiated using these ratios, or alternatively, the partial pressure of germanium may be gradually increased beginning from a lower pressure or zero pressure to form a gradient composition. Alternatively, a silicon layer can be doped by ion implantation with germanium or other processes can be utilized to form layer 14. Preferably, layer 14 is grown by epitaxy to a thickness of less than approximately 5000 Å (and preferably between approximately 1500 Å and 4000 Å).

A strained silicon layer 16 is formed above layer 14 by an epitaxial process. Preferably, layer 16 is grown by CVD at a temperature of approximately 600° C. or less. Layer 16 can be a pure silicon layer and have a thickness of between approximately 50 and 150 Å.

Pad oxide film or oxide layer 18 is provided on layer 16. Layer 18 is optional. Layer 18 is preferably thermally grown on top of substrate 16 to a thickness of between approximately 100 and 300 Å. Layer 16 serves as a buffer layer and can be thermally grown in a conventional high temperature process by heating to approximately 1000° C. in an oxygen atmosphere. Germanium outdiffusion or outgassing are not a problem at this point due to the presence of layer 18.

A barrier or hard mask layer 22 is provided over oxide layer 18. Preferably, mask layer 22 is silicon nitride (Si$_3$N$_4$) provided at a thickness of between approximately 300 and 1000 Å by a deposition or thermal growth process. Preferably, mask layer 22 is provided in a CVD or growth process. A low pressure, plasma enhanced chemical vapor deposition (PECVD) process can also be utilized. A conventional thermal nitride process using a dichlorosilane (SiH$_2$Cl$_2$), ammonia (NH$_3$) and nitrogen (N$_2$) mixture at a high temperature (e.g., 600° C. or above) can be used. The PECVD process for depositing nitride uses silane (SiH$_4$), nitrogen (N$_2$), and ammonia (NH$_3$) with a power of between approximately 550 and 650 watts at 400° C. An ammonia (NH$_3$) silane (SiH$_4$/N$_2$) mixture plasma, as opposed to a N$_2$/NH$_3$/SiCl$_2$H$_2$ associated with conventional CVD or growth process, can be used to form mask layer 22.

Figure 2:
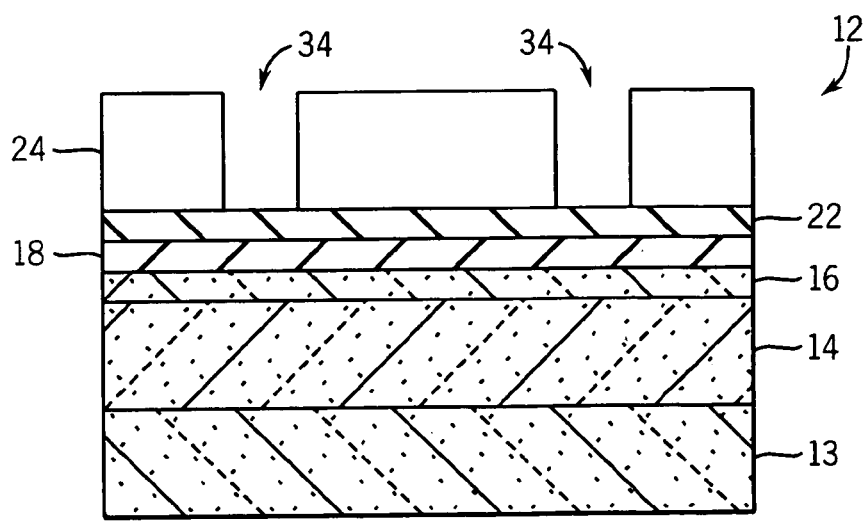
FIG. 2 is a cross-sectional view of the portion illustrated in FIG. 1, showing a lithographic patterning step.
Figure 3:
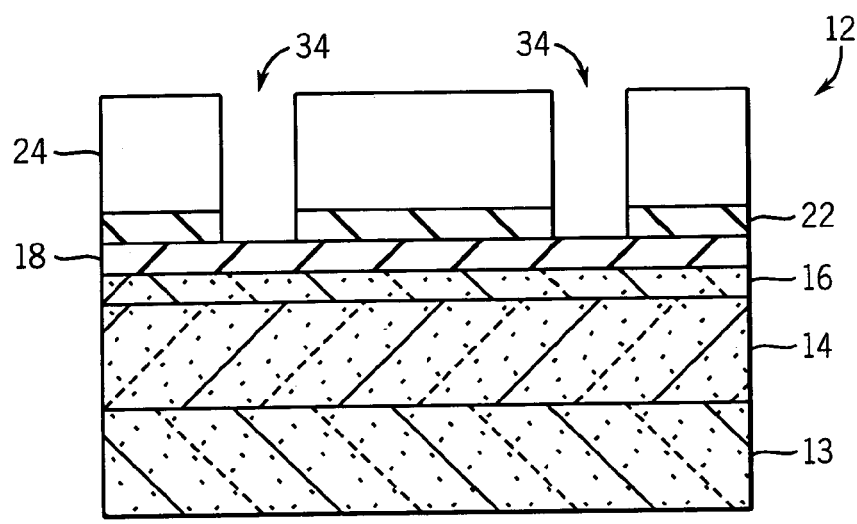
FIG. 3 is a cross-sectional view of the portion illustrated in FIG. 2, showing a selective etching step for the hard mask layer.
Figure 9:
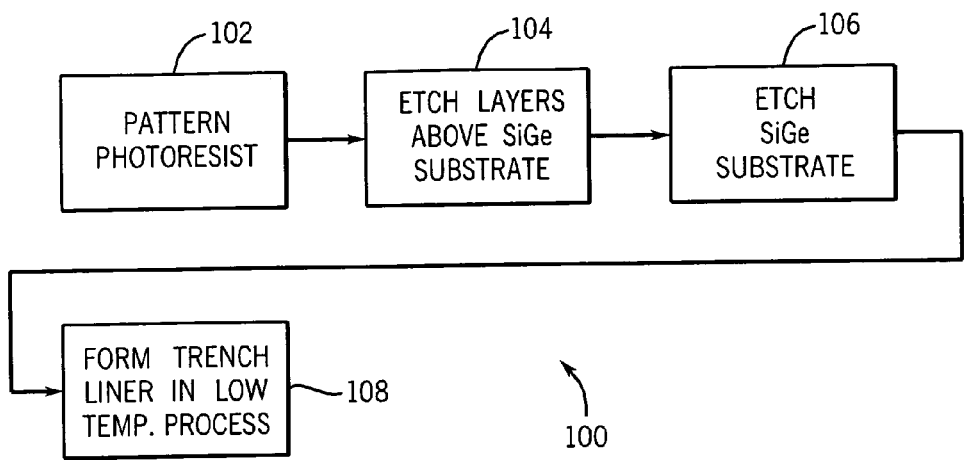
FIG. 9 is a general block diagram showing a shallow trench isolation process for the portion illustrated in FIG. 1

A photoresist layer 24 is spun on top of mask layer 22. Preferably, photoresist layer 24 is any commercially available i-line or deep UV photoresist such as (Shipley Corp., MA) SPR 955 (i-line) UV5 (deep UV). In FIGS. 1 and 2, photoresist layer 24 is selectively removed via photolithographic process to leave apertures 34 in accordance with a step 102 (FIG. 9) of process 100 using pattern 28. In FIG. 3, mask layer 22 is etched via a dry-etching process so that apertures 34 reach oxide layer 18 in accordance with a step 104 of process 100 (FIG. 9). The dry-etching process is selective to silicon nitride with respect to oxide layer 24. Layer 24 can be stripped after layer 22 is etched.

Figure 4:
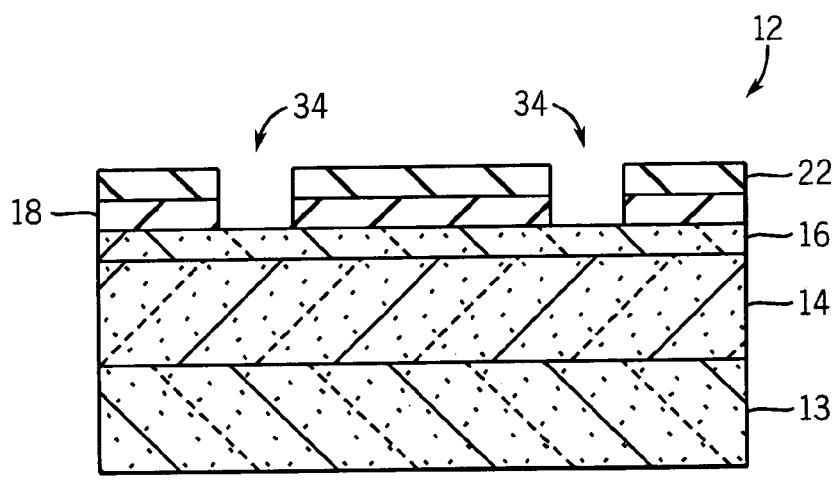
FIG. 4 is a cross-sectional view of the portion illustrated in FIG. 3, showing a selective etching step for the oxide layer.

In FIG. 4, the etch process is changed to etch through silicon dioxide material and layer 18 is etched so that apertures 34 reach layer 16 in accordance with step 104 of process 100 (FIG. 9). Layer 18 can be etched in a dry etching process. Alternatively, other etching techniques can be utilized to remove selected portions of layer 18. Photoresist layer 24 (FIG. 1) can be removed before or after oxide layer 18 is etched.

Figure 5:
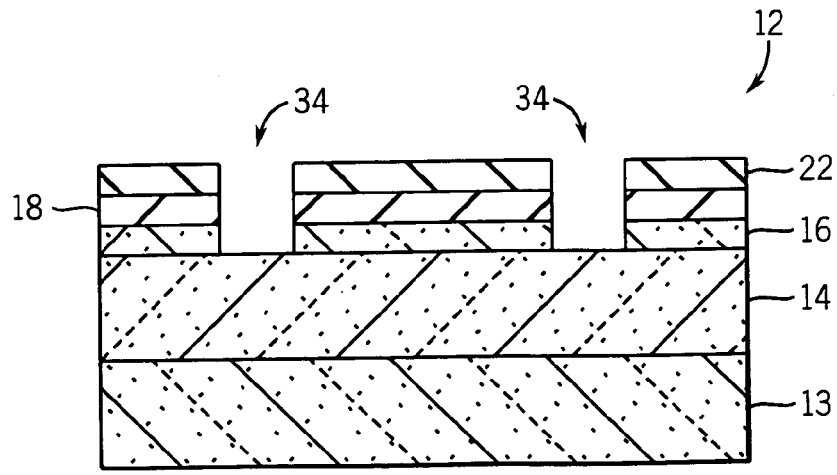
FIG. 5 is a cross-sectional view of the portion illustrated in FIG. 4, showing a selective etching step for the strained silicon layer.

In FIG. 5, the etch process is changed to etch through silicon material. Strained silicon layer 16 can be removed in accordance with a dry-etching process so that apertures 34 reach substrate 14.

Figure 6:
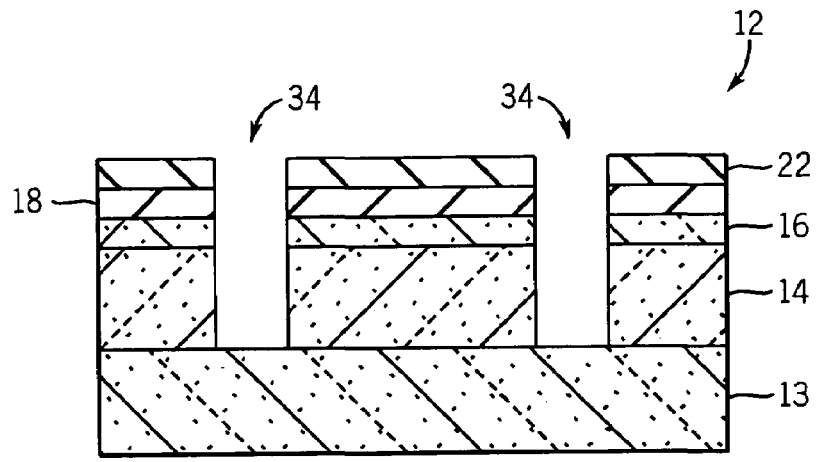
FIG. 6 is a cross-sectional view of the portion illustrated in FIG. 5, showing a selective etching step for the germanium silicon substrate.

In FIG. 6, substrate 14 is etched through apertures 34 to form trenches for shallow trench isolation structures in accordance with a step 106 of process 100 (FIG. 9). The trenches preferably have a width corresponding to that of apertures 34. The trenches preferably have a depth of between approximately 1500 and 4000 Å and a width of 0.18-1.50 μm or less. The trenches can have a trapezoidal cross-sectional shape with the narrower portion being at the bottom. The embodiment discussed with reference to FIGS. 10-21 shows trenches having a trapezoidal cross-sectional shape. Substrate 14 is preferably etched in a dry-etching process to form the trenches. Substrate 14 can be etched in the same step as layer 16.

Although described as being etched in a dry etching process, the trenches can be formed in any process suitable for providing apertures in layer 14. In one embodiment, the apertures for the trenches are provided all the way through layer 14 to substrate 13. Alternatively, the bottom of the trenches associated with apertures 34 may not reach substrate 13, depending upon the thickness of layer 14. In an embodiment in which substrate 13 is not provided, substrate 14 is deeper than the trenches associated with apertures 34.

Figure 7:
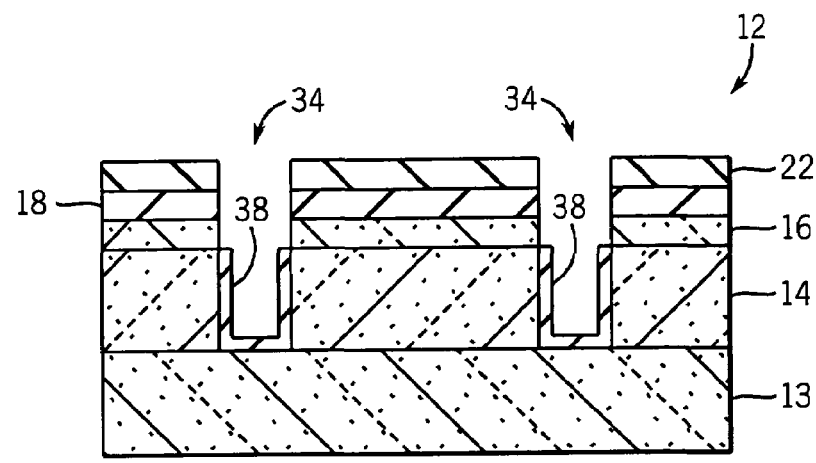
FIG. 7 is a cross-sectional view of the portion illustrated in FIG. 6, showing a low temperature liner formation step.

In FIG. 7, liners 38 are formed in the trenches associated with apertures 34. Preferably, liners 38 are oxide (e.g., silicon oxide or silicon dioxide) material formed in a low temperature process. In one embodiment, liners 38 are between approximately 200 and 500 Å thick and are provided over the bottom and side walls of the trench. In one embodiment, layers 22 and 18 are stripped before the formation of liners 38. In a preferred embodiment, layers 28 and 22 are not stripped until after the trenches are filled. According to an exemplary embodiment, layer 22 is removed in a wet bath, such as a wet bath that includes acid.

Figure 8:
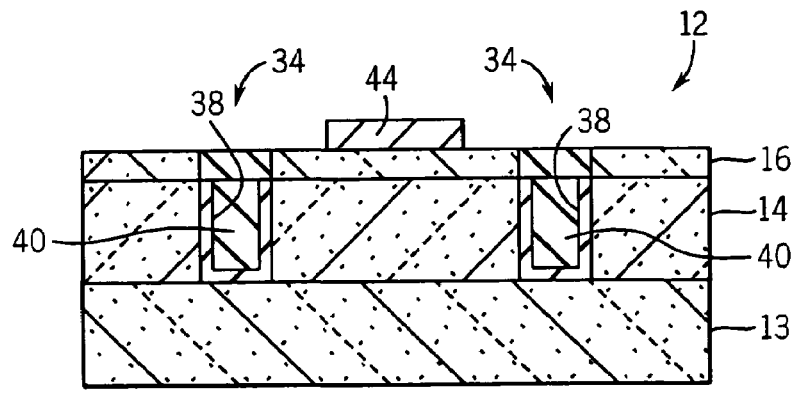
FIG. 8 is a cross-sectional view of the portion illustrated in FIG. 7, showing a gate formation step.

Liners 38 can be formed on layers 16, 18, and 22, although they are shown in FIG. 8 as being formed on substrate 14 only. The embodiment discussed with reference to FIGS. 10-21 shows liners 138 formed on layers 116, 118, and 122 and also above layer 122.

According to one embodiment, liners 38 are formed in an advantageous ultraviolet light ozone (UVO) process. In one embodiment, portion 12 including the trenches associated with apertures 34 are provided in an oxygen atmosphere and subjected to ultraviolet light. In one embodiment, the trenches upon being exposed to UV light react to form ozone (O$_3$) and atomic oxygen (O) by absorbing UV light having a wavelength of approximately 185 nm. Once formed, the ozone can undergo further decomposition to form additional atomic oxygen by absorbing UV light having a wavelength of about 254 nm.

The atomic oxygen acts as a strong oxidizing agent. Both atomic oxygen and ozone may react with the silicon associated with layer 14 and/or layer 16 to form an oxide layer. Although liners 38 are shown only with layer 14, liners 38 can also be grown on side walls associated with layer 16. Exemplary UVO processes are discussed in U.S. Pat. No. 6,168,961 issued to Vaccari on Jan. 2, 2001. Any technique utilizing any UVO technique can be utilized according to this embodiment including adjustments of UVO energies and oxygen environments.

Advantageously, the UVO process is a low temperature process, thereby reducing germanium outdiffusion. Preferably, the UVO process is performed at a temperature of less than approximately 600° C. Although a low temperature is utilized, high quality and good compatibility liners 38 can be produced. In a most preferred embodiment, the UVO temperature process is performed at a temperature well below 600° C. (e.g., below 550° C.).

According to another embodiment, a dual frequency RF power PECVD process is utilized to form liners 38 at a temperature of between approximately 500 and 550° C. Preferably, the chemical vapor deposition process is performed at a low temperature (e.g., less than 700° C.) and utilizes $SiH_4$ and $O_2$ gases. After the formation of a 200-500 Å thick layer for liners 38, a quick rapid thermal anneal (RTA) using an $N_2$ ambient is performed at a temperature between approximately 900 and 1000° C. (e.g., 950° C.) for approximately 30 seconds. Applicant believes that the relatively short RTA time will not cause significant germanium outdiffusion or outgassing.

In yet another embodiment, liners 38 can be formed by an atomic layer deposition (ALD) technique. Preferably, the ALD technique utilizes a temperature of approximately 700° C. with a silane and oxygen atmosphere. According to an exemplary embodiment, a pulse cycle process is utilized for the ALD technique in which $SiH_4$ and $O_2$ gas flows are alternately turned on and off (pulsed) for between approximately 10 and 30 seconds.

In still another embodiment, liners 38 can be formed in a high density plasma oxide deposition (HDP) process similar to the CVD process discussed above. Preferably, the deposition processes do not utilize $NH_3$, instead utilizing silane at a temperature below 700° C. The HDP process preferably utilizes $SiH_4$ and $O_2$ gases and a temperature of between approximately 600 and 650° C. The HDP process utilizes high RF power (e.g., between approximately 4000 and 5000 watts).

In FIG. 8, a layer of insulative material 40 is blanket deposited over layer 16 and within the trenches associated with apertures 34. Insulative material 40 is preferably silicon dioxide deposited in a CVD process. Preferably, insulative material 40 is deposited in a tetraethylorthosilicate (TEOS) process. Alternatively, a boron phosphate silicon glass (BPSG) process can be utilized. Insulative material 40 is preferably between approximately 2000 and 8000 Å thick.

Insulative material 40 is removed by polishing/etching until a top surface of layer 16 is reached. The removal of insulative material 40 leaves oxide material within the trenches associated with apertures 34. Insulative material 40 can be removed by a number of stripping or etching processes. Preferably, insulative material 40 is removed from above layer 16 by dry-etching.

In one embodiment, insulative material 40 is deposited after the trenches are formed and before layer 22 is stripped. The insulative material is polished or etched until layer 22 is reached. Layers 22 and 18 can be stripped in a subsequent process.

Although material is shown in FIG. 8 as being a single structure formed within the trenches (above the top surface and side surfaces of liners 38) to a top surface of layer 16, insulative material 40 may stop at a top surface of liners 38.

After insulative material 40 is provided in the trenches associated with apertures 34, a gate structure 44 can be provided. Gate structure 44 can be a conventional MOSFET gate structure, such as, a metal over oxide gate structure or polysilicon over oxide gate structure. In one embodiment, gate structure 44 is comprised of a tantalum nitride or titanium nitride gate conductor formed by a plasma vapor deposition sputtering technique. During sputtering, nitrogen ($N_2$) gas can be provided to modify the metal and nitrogen composition of the gate conductor. This modification can be used to adjust a work function associated with the gate structure 44. For example, a 200 millivolt shift in threshold voltage can be achieved by adjusting the flow of nitrogen gas associated with gate structure 44.

FIGS. 10 through 21 illustrate a method of manufacturing an integrated circuit (IC) in accordance with another exemplary embodiment. The method illustrated in FIGS. 10 through 21 reduces germanium outgassing and outdiffusion problems associated with silicon germanium structures. The process can be used in a shallow trench isolation (STI) process or any process requiring a liner oxide and utilizing germanium or other substance prone to outgassing at high temperature. Advantageously, a liner oxide layer can be formed from another layer formed at low temperature and yet provides a high quality oxide with good compatibility. Low temperature for the embodiment discussed with reference to FIGS. 10-21 is a temperature below approximately 900° C. Similar structures in FIGS. 1-8 have similar reference numerals (differing by 100) to the structures illustrated in FIGS. 10-20.

Figure 21:
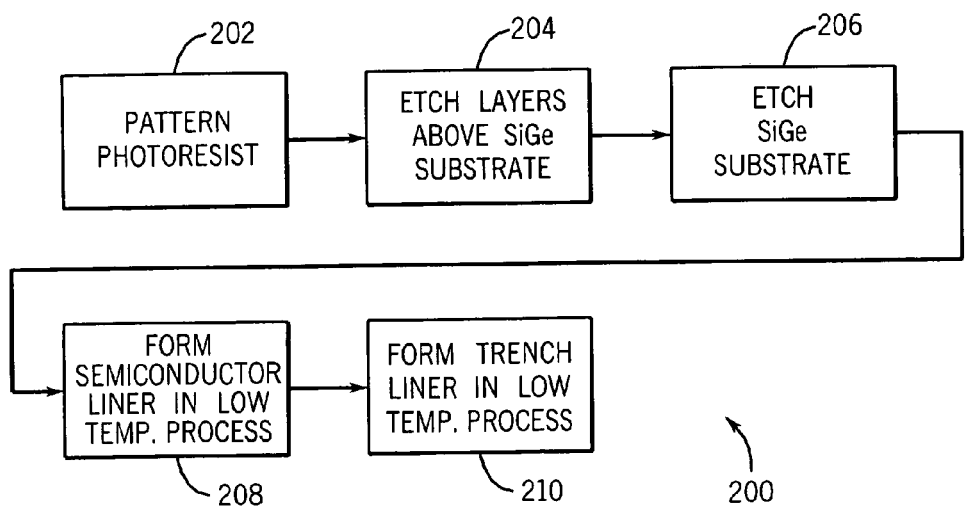
FIG. 21 is a general block diagram showing a shallow trench isolation process for the portion illustrated in FIG. 10 in accordance with another exemplary embodiment.
Figure 10:
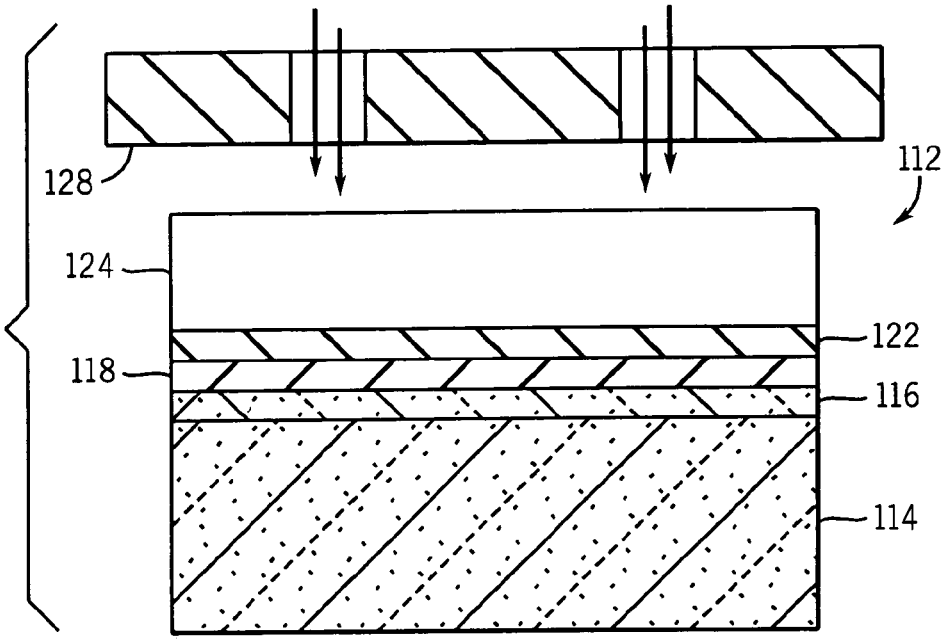
FIG. 10 is a cross-sectional view schematic drawing of a portion of a silicon germanium substrate including a strained silicon layer, an oxide layer, a hard mask layer and a photoresist layer in accordance with another exemplary embodiment of a shallow trench isolation (STI) process.

Referring to FIGS. 10 and 21, a cross-sectional view of a portion 112 of an integrated circuit (IC) is illustrated. Portion 112 (FIG. 10) is subjected to process 200 (FIG. 21) to form a shallow trench isolation (STI) structure. Portion 112 includes an oxide layer 118 provided over a strained silicon layer 116. Layer 116 is provided over a semiconductor substrate 114 or a germanium containing layer or substrate. Substrate 114 can be provided above a substrate such as substrate 13 (FIG. 1).

Portion 112 can be any type of semiconductor device, or portion thereof, made from any of the various semiconductor processes such as a complementary metal oxide semiconductor (COMs) process, bipolar process, or other semiconductor process. Portion 112 may be an entire IC or a portion of an IC including a multitude of electronic component portions.

Substrate 114 is preferably a silicon germanium or other semiconductor material including germanium, and can be doped with P-type dopants or N-type dopants. Substrate 114 can be an epitaxial layer provided on a semiconductor or an insulative base, such as substrate 13. Furthermore, substrate 114 is preferably a composition of silicon germanium ($Si_{1-x}Ge_x$, where X is approximately 0.2 and is more generally in the range of 0.1-0.4). Substrate 114 can be part of a wafer and can be similar to substrate 14 (FIG. 1).

A strained silicon layer 116 is formed above layer 114 by an epitaxial process. Preferably, layer 118 is grown by CVD at a temperature of approximately 600° C. or less. Layer 118 can be a pure silicon layer and have a thickness of between approximately 50 and 150 Å.

Pad oxide film or oxide layer 118 is provided on layer 116. Layer 118 is optional. Layer 118 is preferably thermally grown on top of substrate 118 to a thickness of approximately 100-300 Å. Layer 118 serves as a buffer layer and can be thermally grown in a conventional high temperature process by heating to 1000° C. in an oxygen atmosphere. Germanium outdiffusion and outgassing are not a problem at this point due to the presence of layer 118.

A barrier or hard mask layer 122 is provided over oxide layer 118. Preferably, mask layer 122 is silicon nitride ($Si_3N_4$) provided at a thickness of between approximately 300 and 1000 Å by a deposition or thermal growth process. Preferably, mask layer 122 is provided in a CVD or growth process and can be similar to layer 22 (FIG. 1).

Figure 11:
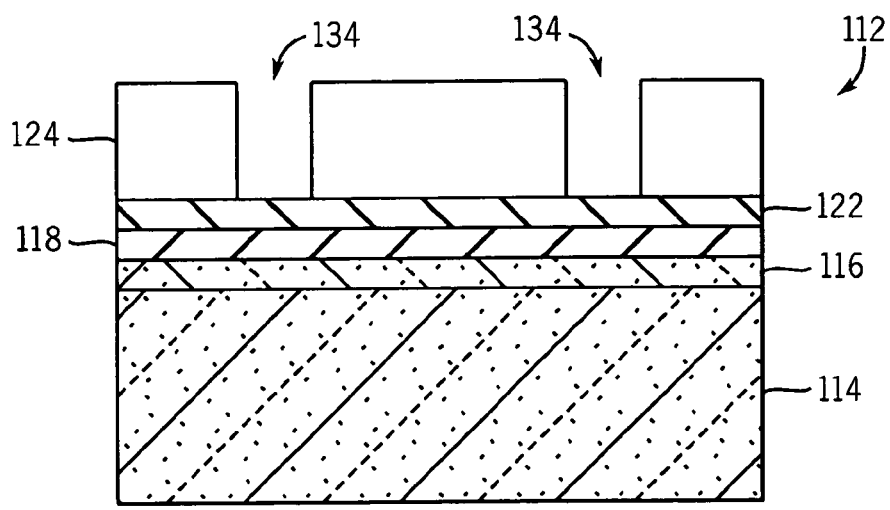
FIG. 11 is a cross-sectional view of the portion illustrated in FIG. 10, showing a lithographic patterning step.

A photoresist layer 124 is spun on top of mask layer 122. Preferably, photoresist layer 124 is any commercially available i-line or deep UV photoresist such as (Shipley Corp., MA) SPR 955 (i-line) UV5 (deep UV). In FIG. 11, photoresist layer 124 is selectively removed via a photolithographic process to leave apertures 134 in accordance with a step 202 (FIG. 21) of process 200 using pattern 128.

Figure 12:
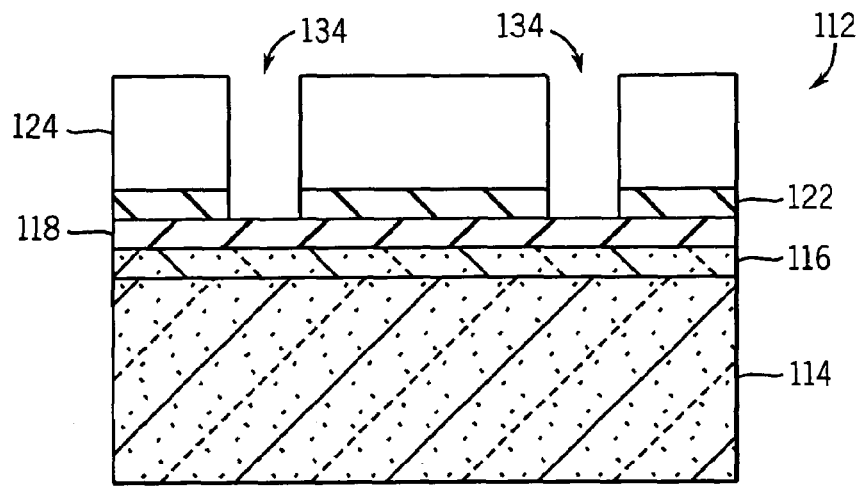
FIG. 12 is a cross-sectional view of the portion illustrated in FIG. 11, showing a selective etching step for the hard mask layer.

In FIG. 12, mask layer 122 is etched via a dry-etching process so that apertures 134 reach oxide layer 118 in accordance with a step 104 of process 200 (FIG. 21). The dry-etching process is selective to silicon nitride with respect to oxide layer 124. Layer 124 can be stripped after layer 122 is etched.

Figure 13:
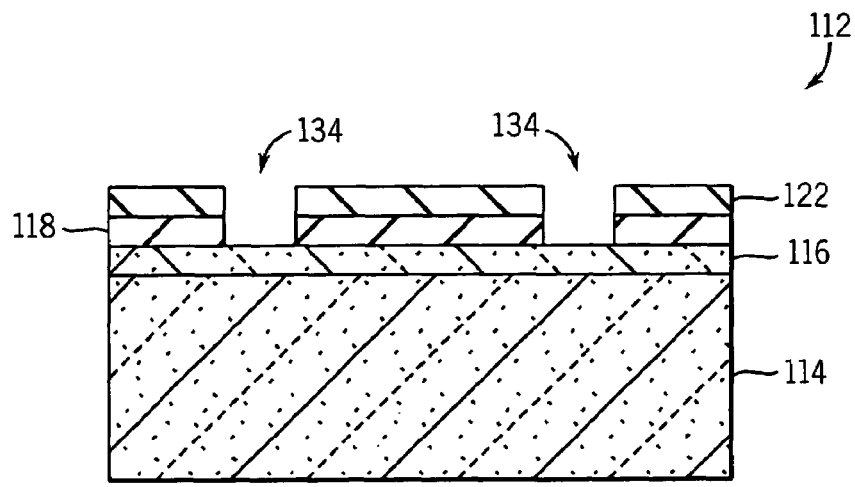
FIG. 13 is a cross-sectional view of the portion illustrated in FIG. 12, showing a selective etching step for the oxide layer.

In FIG. 13, the etch process is changed to etch through silicon dioxide material and layer 118 is etched so that apertures 134 reach layer 116 in accordance with step 204 of process 200 (FIG. 21). Layer 118 can be etched in a dry etching process. Alternatively, other etching techniques can be utilized to remove selected portions of layer 118. Photoresist layer 124 (FIG. 10) can be removed before or after oxide layer 118 is etched.

Figure 14:
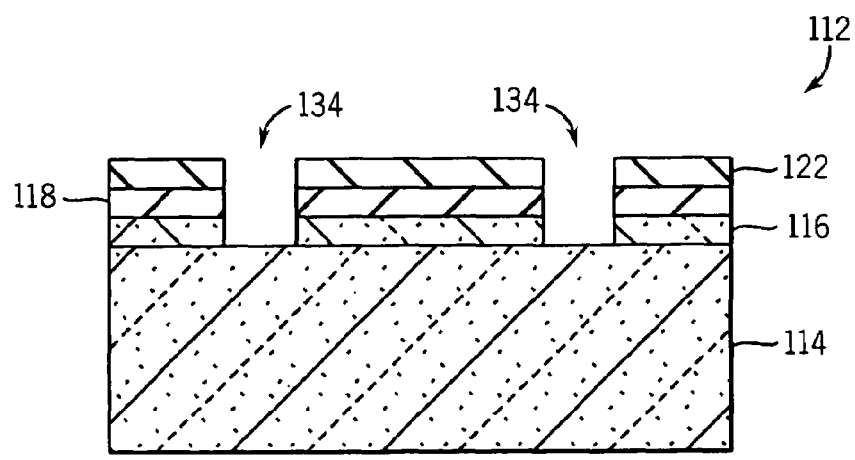
FIG. 14 is a cross-sectional view of the portion illustrated in FIG. 13, showing a selective etching step for the strained silicon layer.

In FIG. 14, the etch process is changed to etch through silicon material. Strained silicon layer 116 can be removed in accordance with a dry-etching process so that apertures 134 reach substrate 114.

Figure 15:
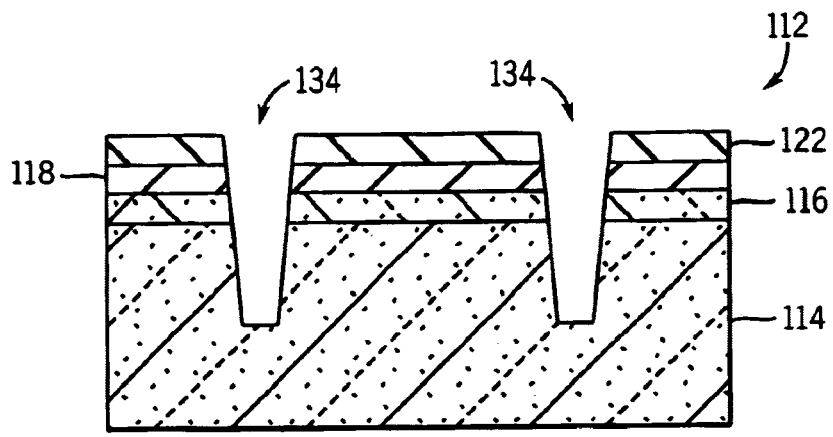
FIG. 15 is a cross-sectional view of the portion illustrated in FIG. 14, showing a selective etching step for the germanium silicon substrate.

In FIG. 15, substrate 114 is etched through apertures 134 to form trenches for a shallow trench isolation structure in accordance with a step 206 of process 200 (FIG. 21). The trenches preferably have a width corresponding to apertures 134. The trenches preferably have a depth of between approximately 1500 and 4000 Å and a width of 0.18-1.50 µm or below. The trenches can have a trapezoidal cross-sectional shape with the narrower portion being at the bottom. The trenches can also have other cross-sectional shapes. Substrate 114 is preferably etched in a dry-etching process to form the trenches. Substrate 114 can be etched in the same step as layer 116.

Although described as being etched in a dry etching process, the trenches can be formed in any process suitable for providing an aperture in layer 114. In one embodiment, the apertures for the trenches are provided all the way through layer 114 to another substrate (e.g., substrate 13 in FIG. 1).

Figure 16:
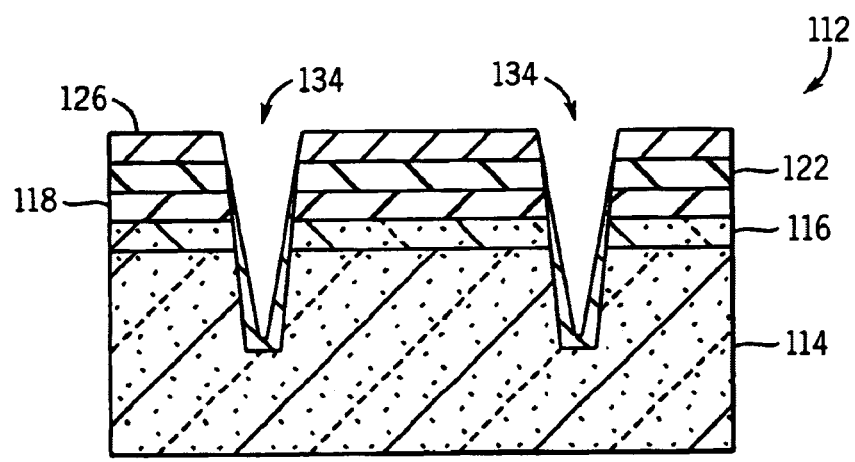
FIG. 16 is a cross-sectional view of the portion illustrated in FIG. 15, showing a semiconductor deposition step.

In FIG. 16, a conformal layer 126 is formed in the trenches and above layer 122. In one embodiment, layer 126 is a semiconductor or metal layer that can be formed at a low temperature (e.g., below 600° C.). Layer 126 is preferably a layer that can be oxidized to form an insulative material such as an oxide liner. Most preferably, layer 126 is a 100-200 Å thick amorphous silicon layer deposited by CVD at a temperature of 500-600° C. Layer 126 is deposited in accordance with step 208 of process 200 (FIG. 21).

In another embodiment, layer 126 is a metal or semiconductor material deposited by atomic layer deposition (ALD) at low temperature. Layer 126 can be a silicon layer. The silicon layer can be non-amorphous.

Figure 17:
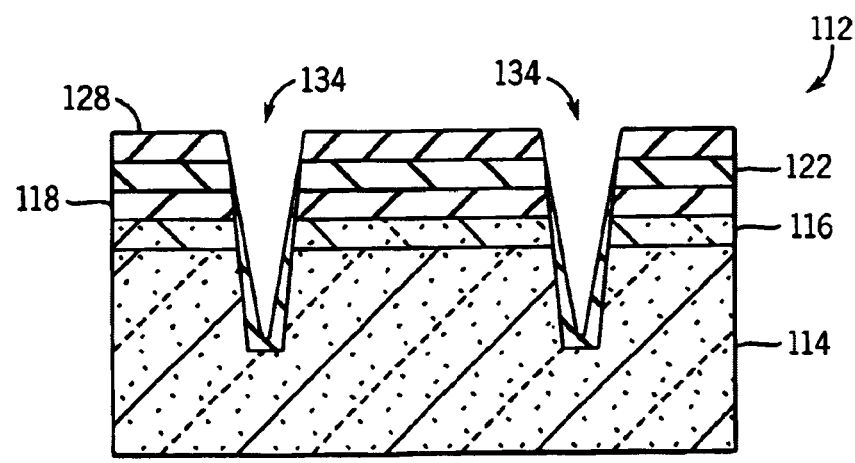
FIG. 17 is a cross-sectional view of the portion illustrated in FIG. 16, showing a liner formation step.

Layer 126 is preferably provided in sidewalls of the trenches associated with apertures 124 of layer 114 and of layers 116, 118 and 122. Layer 126 is also provided on a top surface of layer 122. In FIG. 17, layer 126 is converted to an insulative material such as a liner oxide material 128. Preferably, layer 126 (FIG. 16) is formed into liner oxide material 128 in an oxidation process at a temperature of approximately 900° C. Preferably, the oxidation process can occur at a higher temperature. Germanium outdiffusion is reduced due to the barrier associated with layer 126. Preferably, the entire layer 126 is converted into liner oxide material 128.

Figure 18:
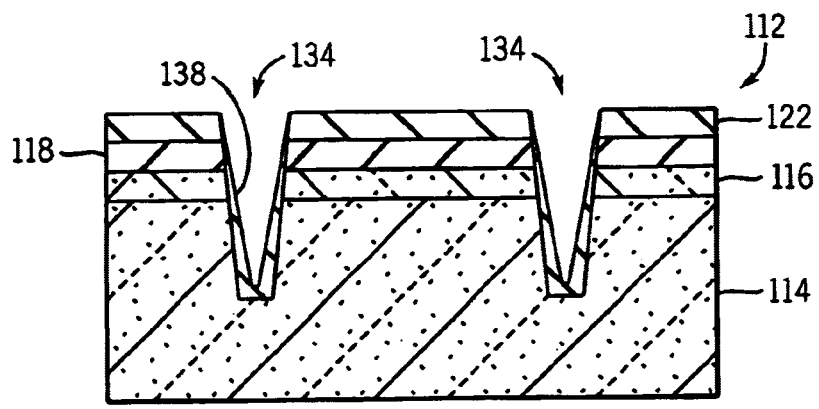
FIG. 18 is a cross-sectional view of the portion illustrated in FIG. 17, showing a selective liner removal step.

In FIG. 18, layer 122 is planarized or etched to remove liner oxide material 128 from the top surface of layer 122. Alternatively, layer 126 can be removed from top surface of layer 122 before liner oxide material 128 is formed. Liner oxide material 128 remains as liner 138 within the trenches associated with aperture 134.

In FIG. 18, liners 138 are formed in the trenches associated with apertures 134. Preferably, liners 138 are oxide (e.g., silicon oxide or silicon dioxide) material formed by oxidizing a semiconductor or metal layer. In one embodiment, liners 138 are approximately 200-500 Å thick. In one embodiment, layers 122 and 118 are stripped before the formation of liners 138. In a preferred embodiment, layers 128 and 122 are not stripped until after the trenches are filled. According to an exemplary embodiment, layer 122 is removed in a wet bath, such as a wet bath that includes acid.

Figure 19:
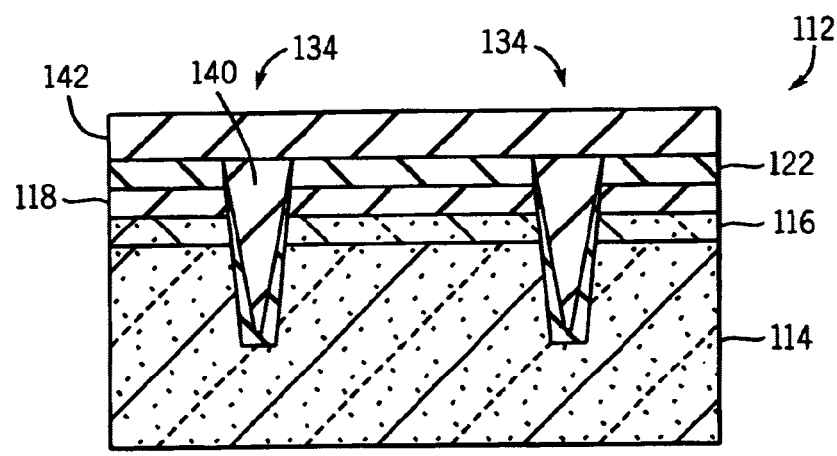
FIG. 19 is a cross-sectional view of the portion illustrated in FIG. 18, showing a trench fill step.

In FIG. 19, a layer 142 of insulative material 140 is blanket deposited over layer 116 and within trenches associated with apertures 134. Insulative material 140 is preferably silicon dioxide deposited in an HDP process and similar to material 40 (FIG. 8). Preferably, insulative material 140 is deposited in a silane ($SiH_4$) process. Alternatively, a boron phosphate silicon glass (BPSG) process can be utilized. Insulative material 140 is preferably between approximately 2000 and 8000 Å thick.

Insulative material 140 is removed by polishing/etching until a top surface of layer 122 is reached. The removal of insulative layer leaves oxide material 140 within the trenches associated with apertures 134. Insulative layer 140 can be removed by a number of stripping or etching processes. Preferably, insulative material 140 is removed from above layer 122 by dry-etching.

In one embodiment, insulative layer 142 associated with material 140 is deposited after the trenches are formed and layers 122 and 116 are stripped. Insulative layer 142 is polished or etched until layer 122 is reached.

Although material is shown in FIG. 19 as being a single structure formed within the trenches (above the top surface and side surfaces of liners 138) to a top surface of layer 116, insulative material 140 may stop at a top surface of liners 138.

Figure 20:
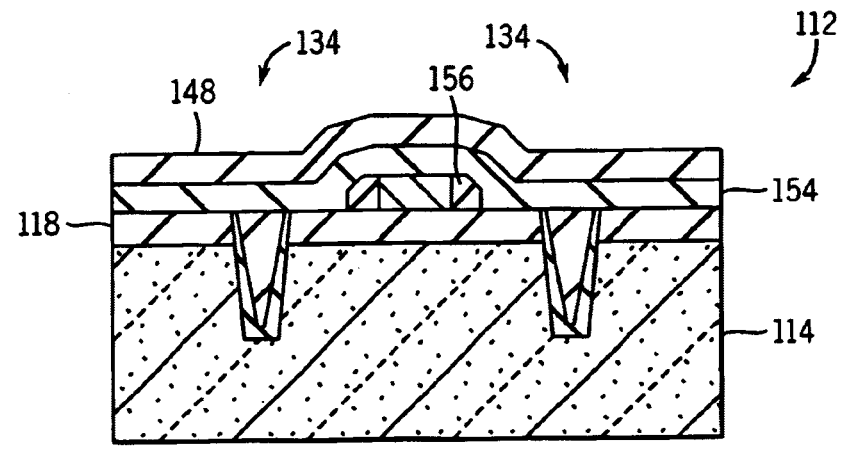
FIG. 20 is a cross-sectional view of the portion illustrated in FIG. 19, showing a gate formation step.

In FIG. 20, after material 140 is provided in the trenches associated with apertures 134, a gate structure 156 can be provided. Gate structure 156 can be a conventional MOSFET gate structure, such as, a metal over oxide gate structure or polysilicon over oxide gate structure. In one embodiment, gate structure 156 is covered with an oxide (e.g., silicon dioxide layer 154) and a silicon carbide (SiC) layer 148. Portion 112 is subjected to an anneal after layers 154 and 148 are provided. Layer 148 can prevent germanium outgassing.

The technique of using layers 148 and 154 can be particularly advantageous if layer 118 is not utilized with portion 112 and gate structure 156 is provided directly over a germanium containing substrate. In another embodiment, layer 148 can be a tantalum nitride (TaN), titanium nitride (TiN), tungsten nitride (TuN), titanium/titanium nitride (Ti/TiN) layer of approximately 100 Å thick and layer 154 can be a silicon dioxide layer approximately 100 Å thick. The spacers associated with gate structure 156 can be silicon nitride.

It is understood that while the detailed drawings, specific examples, and particular values given provide a preferred exemplary embodiment of the present invention, it is for the purpose of illustration only. The shapes and sizes of trenches are not disclosed in a limiting fashion. The method and apparatus of the invention is not limited to the precise details and conditions disclosed. Various changes may be made to the details disclosed without departing from the spirit of the invention, which is defined by the following claims.

What is claimed is:

1. A method of manufacturing an integrated circuit having trench isolation regions in a substrate including gennanium, the method comprising:

forming a mask layer above the substrate;

selectively etching the mask layer to form apertures associated with locations of the trench isolation regions;

forming trenches in the substrate at the locations;

providing a semiconductor or metal layer within the trenches and in contact with the substrate in a low temperature process below approximately 600° C.; and forming oxide liners in contact with the substrate using the semiconductor or metal layer in the trenches of the substrate;

whereby the low temperature process is intended to prevent germanium outgassing.

2. The method of claim 1, further comprising providing an insulative material in the trenches to form the trench isolation regions.

3. The method of claim 2, further comprising removing the insulative material until the mask layer is reached.

4. The method of claim 1, wherein the low temperature process is between 500-600° C.

5. The method of claim 1, wherein the semiconductor or metal layer includes amorphous semiconductor material.

6. The method of claim 2, wherein the low temperature process is performed at a temperature of less than 600° C. and the semiconductor or metal layer is amorphous silicon.

7. The method of claim 1, wherein the forming oxide liners step is an oxidation process.

8. A method of forming shallow trench isolation regions in a semiconductor layer comprising germanium, the method comprising:

providing a hard mask layer above the semiconductor layer;

providing a photoresist layer above the hard mask layer;

selectively removing portions of the photoresist layer at locations in a photolithographic process;

removing the hard mask layer at the locations;

forming trenches in the semiconductor layer under the locations;

providing a conformal semiconductor layer in the trenches and in contact with the semiconductor layer at a temperature of less than approximately 600° C.; and converting the conformal semiconductor layer into an oxide liner in the trenches, the oxide liner incontact with the semiconductor layer.

9. The method of claim 8, further comprising:

providing a pad oxide layer above a strained silicon layer before the providing a hard mask layer step.

10. The method of claim 9, further comprising:

removing the pad oxide layer at the locations before the forming trenches step.

11. The method of claim 8, further comprising:

providing an insulative material in the trenches to form the shallow trench isolation regions; and removing the hard mask layer in a wet bath.

12. The method of claim 11, wherein the wet bath includes acid.

13. The method of claim 8, wherein the conformal semiconductor layer is provided in a low temperature process between approximately 500° and 600° C.

14. The method of claim 13, wherein the conformal semiconductor layer comprises non-amorphous silicon.

15. The method of claim 14, wherein the oxide liner is silicon dioxide grown in an oxygen atmosphere.

16. A method of forming a liner in a trench in a germanium containing layer, the method comprising:

selectively etching the germanium containing layer to form the trench;

providing a semiconductor layer in the trench and in contact with the germanium containing layer in a low temperature process below approximately 600° C.; and forming an oxide liner from the semiconductor layer, the oxide liner in contact with the germanium containing layer.

17. The method of claim 16, wherein the low temperature process is a deposition process performed at a temperature below 600° C.

18. The method of claim 16, wherein the semiconductor layer in the trench comprises amorphous silicon.

19. The method of claim 18, wherein the oxide liner is 200-500 Å thick.

* * * * *

UNITED STATES PATENT AND TRADEMARK OFFICE
CERTIFICATE OF CORRECTION

PATENT NO. : 7,422,961 B2
APPLICATION NO. : 10/389456
DATED : September 9, 2008
INVENTOR(S) : Wang et al.

It is certified that error appears in the above-identified patent and that said Letters Patent is hereby corrected as shown below:

Column 10:
line 65, replace "gennanium" with --germanium--.

Column 12:
line 2, replace "incontact" with --in contact--.

Signed and Sealed this

Eighteenth Day of November, 2008

JON W. DUDAS
*Director of the United States Patent and Trademark Office*